(12) United States Patent
Carroll

(10) Patent No.: US 12,142,481 B2
(45) Date of Patent: Nov. 12, 2024

(54) FORMING PASSIVATION STACK HAVING ETCH STOP LAYER

(71) Applicant: Polar Semiconductor, LLC, Bloomington, MN (US)

(72) Inventor: Roger Carroll, Rosemount, MN (US)

(73) Assignee: Polar Semiconductor, LLC, Bloomington, MN (US)

( * ) Notice: Subject to any disclaimer, the term of this patent is extended or adjusted under 35 U.S.C. 154(b) by 10 days.

(21) Appl. No.: 17/647,086

(22) Filed: Jan. 5, 2022

(65) Prior Publication Data
US 2023/0215727 A1 Jul. 6, 2023

(51) Int. Cl.
H01L 21/02 (2006.01)
H01L 21/463 (2006.01)
H01L 21/465 (2006.01)
H01L 21/469 (2006.01)

(52) U.S. Cl.
CPC ...... *H01L 21/02422* (2013.01); *H01L 21/463* (2013.01); *H01L 21/465* (2013.01); *H01L 21/469* (2013.01)

(58) Field of Classification Search
CPC ............. H01L 21/02422; H01L 21/463; H01L 21/465; H01L 21/469
See application file for complete search history.

(56) References Cited

U.S. PATENT DOCUMENTS

| | | | | |
|---|---|---|---|---|
| 5,840,623 A | * | 11/1998 | Sahota | H01L 21/31053 257/E21.244 |
| 5,885,894 A | * | 3/1999 | Wu | H01L 21/31612 438/692 |
| 6,001,746 A | * | 12/1999 | Tsai | H01L 21/02211 438/758 |
| 6,372,670 B1 | * | 4/2002 | Maeda | H01L 21/0228 438/787 |
| 6,376,394 B1 | * | 4/2002 | Tsai | H01L 21/31053 257/E21.244 |
| 6,448,650 B1 | * | 9/2002 | Saran | H01L 24/03 257/773 |
| 6,518,626 B1 | * | 2/2003 | Moore | H01L 21/0214 257/E21.507 |
| 10,868,240 B2 | | 12/2020 | Liu et al. | |
| 11,630,169 B1 | | 4/2023 | Liu et al. | |
| 2001/0011700 A1 | * | 8/2001 | Shimada | B82Y 20/00 250/234 |
| 2002/0123217 A1 | * | 9/2002 | Subramanian | H01L 21/76829 257/E21.035 |
| 2003/0087522 A1 | * | 5/2003 | Ngo | H01L 21/76882 438/622 |
| 2003/0201440 A1 | * | 10/2003 | Satou | H01L 29/66765 257/E21.414 |
| 2007/0293052 A1 | * | 12/2007 | Le Roy | H01L 21/3065 438/708 |

(Continued)

Primary Examiner — William B Partridge
Assistant Examiner — David Paul Sedorook
(74) Attorney, Agent, or Firm — DALY, CROWLEY, MOFFORD & DURKEE, LLP

(57) ABSTRACT

In one aspect, a method includes depositing a first glass layer on a metallization layer and depositing an etch stop layer on the first glass layer. The method further includes depositing a second glass layer on the etch stop layer and polishing the second glass layer down to at least a surface of the etch stop layer.

24 Claims, 9 Drawing Sheets

(56) References Cited

U.S. PATENT DOCUMENTS

| | | | |
|---|---|---|---|
| 2012/0032238 A1* | 2/2012 | Teo | H01L 29/78 |
| | | | 257/E21.585 |
| 2012/0044039 A1* | 2/2012 | Feichtinger | H01C 7/18 |
| | | | 338/20 |
| 2013/0012001 A1* | 1/2013 | Sakurai | H01L 33/0075 |
| | | | 257/E21.09 |
| 2018/0315852 A1* | 11/2018 | Ozkan | H01L 21/02178 |
| 2019/0047906 A1* | 2/2019 | Weber | C03C 15/00 |
| 2020/0165725 A1* | 5/2020 | Sato | C23C 16/45553 |
| 2020/0266337 A1 | 8/2020 | Liu et al. | |
| 2020/0273784 A1* | 8/2020 | Mallik | H01L 25/50 |
| 2021/0057642 A1 | 2/2021 | Liu et al. | |
| 2021/0098285 A1 | 4/2021 | LaRoche et al. | |
| 2022/0352076 A1* | 11/2022 | Ecton | H01L 23/5383 |
| 2023/0228828 A1 | 7/2023 | Klebanov et al. | |

* cited by examiner

FORMING PASSIVATION STACK HAVING ETCH STOP LAYER

BACKGROUND

During fabrication of integrated circuits (ICs), a top metallization layer is added and etched to form metal portions that will be used as bond pads to access the IC. Typically, after this stage of IC fabrication, a passivation stack is deposited on the ICs to protect the IC from amongst things such as electrostatic discharge, unwanted debris and so forth. If the passivation stack thickness across a die has high variation, then there may be process issues. For example, if the passivation stack is too thick it will take longer to etch a via to the bond pads. In another example, if the passivation stack is too thin, then some portions of the IC may become over-etched (e.g., portions of the bond pad are etched away).

SUMMARY

In one aspect, a method includes depositing a first glass layer on a metallization layer and depositing an etch stop layer on the first glass layer. The method further includes depositing a second glass layer on the etch stop layer and polishing the second glass layer down to at least a surface of the etch stop layer.

In another aspect, an integrated circuit (IC) includes a metallization layer and a passivation stack on the metallization layer. The passivation stack includes an etch stop layer.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAIL DESCRIPTION

Described herein are techniques to form a passivation stack having an etch stop layer. The techniques described herein enable for a passivation stack that is thicker than a top of metallization layer that reduces or eliminates passivation stack cracking. Without an etch stop layer, the variation in the passivation stack thickness may be excessive, thus the pad etch may have endpoint issues, which may require excessive over etch to ensure that the pads are clear of oxide and other materials but results in scrapping die lots due to poor endpoint detection. The techniques described herein minimize pad etch time and keep the passivation stack thickness over the pads consistent.

Other advantages of the techniques described herein include but are limited to: reducing the amount of glass layers that are deposited because the etch stop layer is part of the passivation stack, reducing thickness variations across a die, reducing polishing and etching time during processing, using similar processing techniques as pad etching processes, and so forth.

Figure 1A:
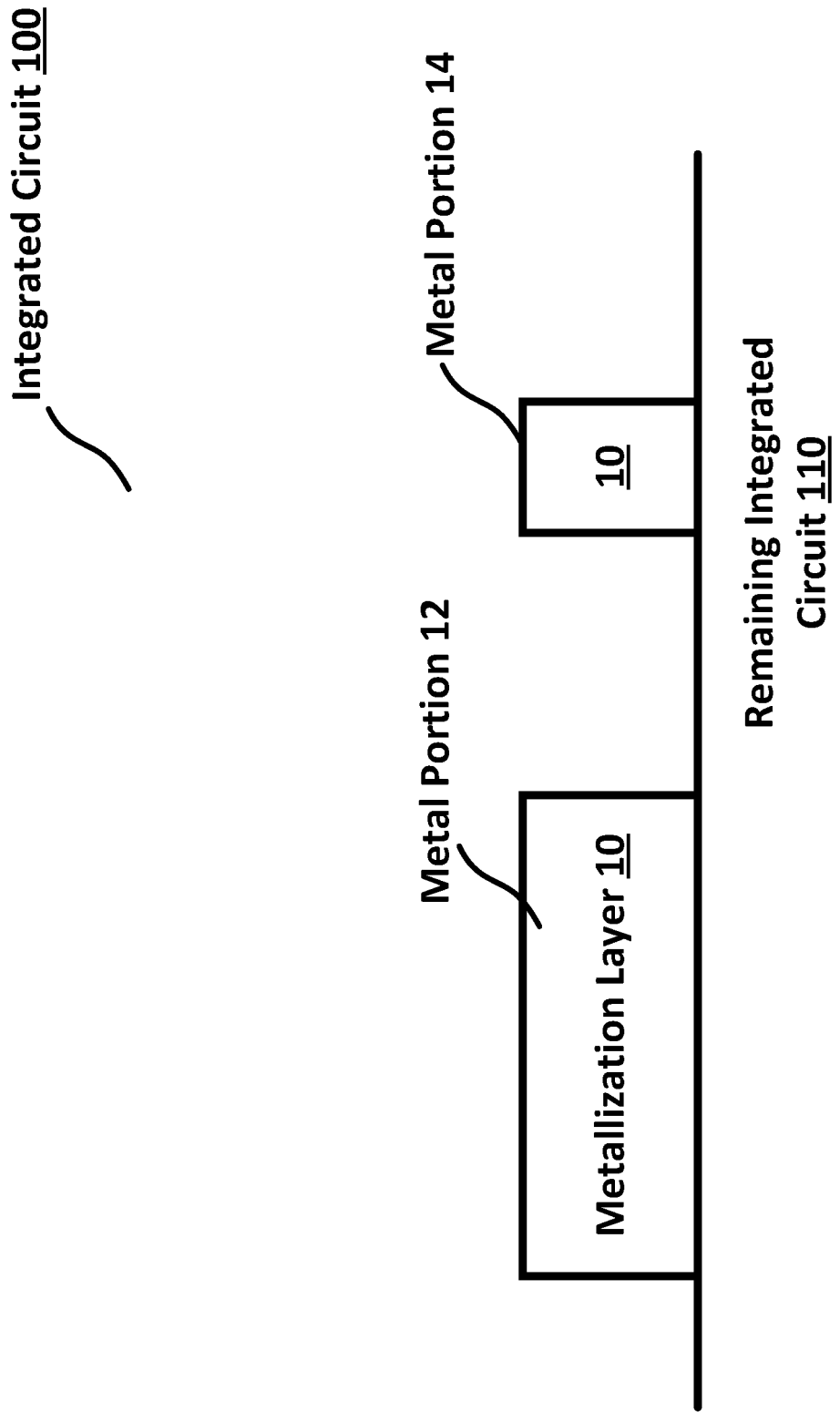
FIGS. 1A to 1G are diagrams of an example of forming a passivation stack having an etch stop layer as part of an integrated circuit (IC)

Referring to FIG. 1A, a metallization layer 10 is part of an integrated circuit (IC) 100. The metallization layer 10 includes a metal portion 12 and a metal portion 14 on top of the remaining IC 110. The remaining IC 110 may include electronic circuitry such as transistors, capacitors, logic circuits and so forth. In one example, the metal portion 12 and/or the metal portion 14 may be used as bond pads. In one example, the metallization layer is about 2.5 microns thick±0.5 microns.

Figure 1B:
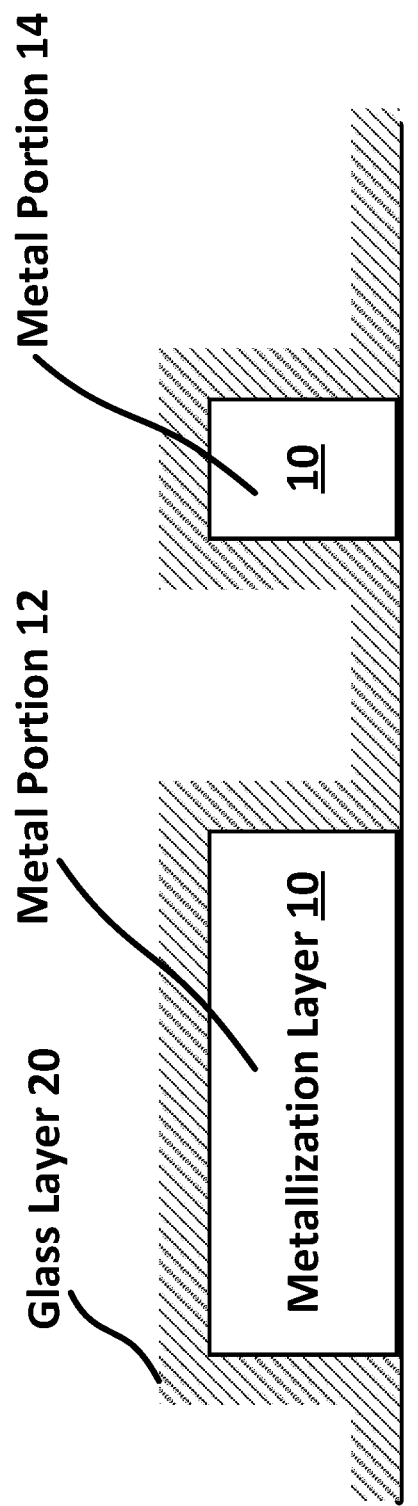

Referring to FIG. 1B, a glass layer 20 is applied to the metallization layer 10 covering the metal portion 12 and the metal portion 14. In one example, the glass layer 20 may include tetraethyl orthosilicate (TEOS). In other examples, the glass layer 20 may include other dielectric films such as silicon oxynitride or doped silicon dioxide. In one example, the glass layer 20 may be about 0.4 microns thick±0.1 microns. In other examples, the glass layer 20 may be between 0.2 to 1.2 microns. In still further examples, the glass layer 20 may be thicker than 1.2 microns.

Figure 1C:
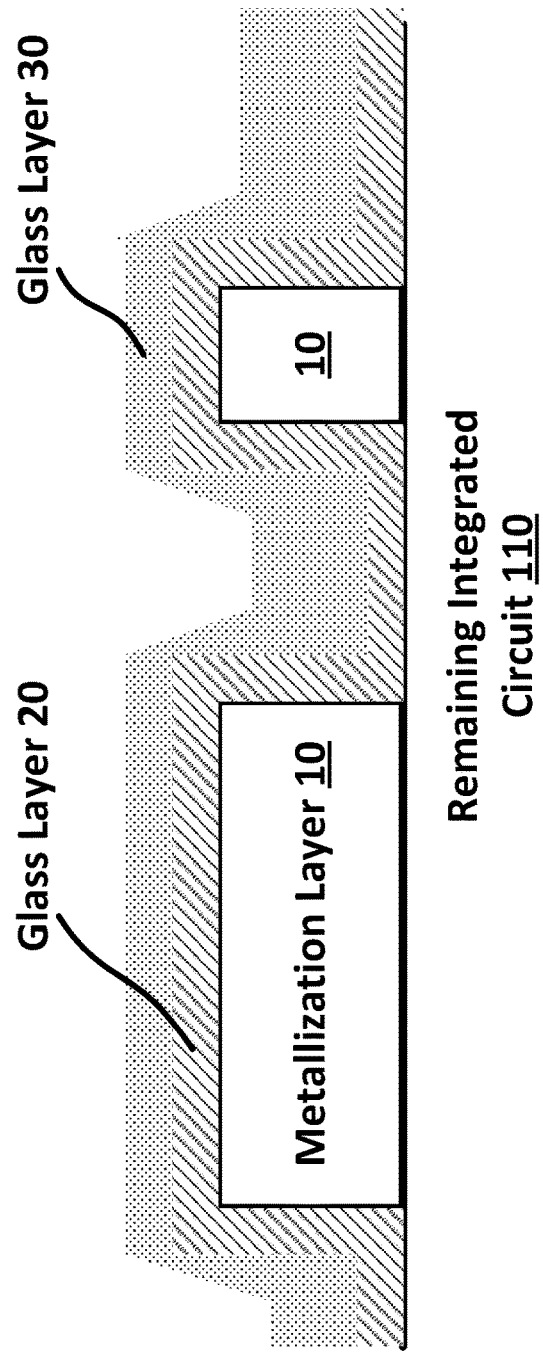

Referring to FIG. 1C, a glass layer 30 is deposited onto the glass layer 20. For example, the glass layer 30 may include a silane-based glass (e.g., silicon dioxide). In other examples, the glass layer 30 may include silicon oxynitride or doped silicon dioxide. In one example, the glass layer 30 may be about 0.7 microns thick±0.1 microns.

Figure 1D:
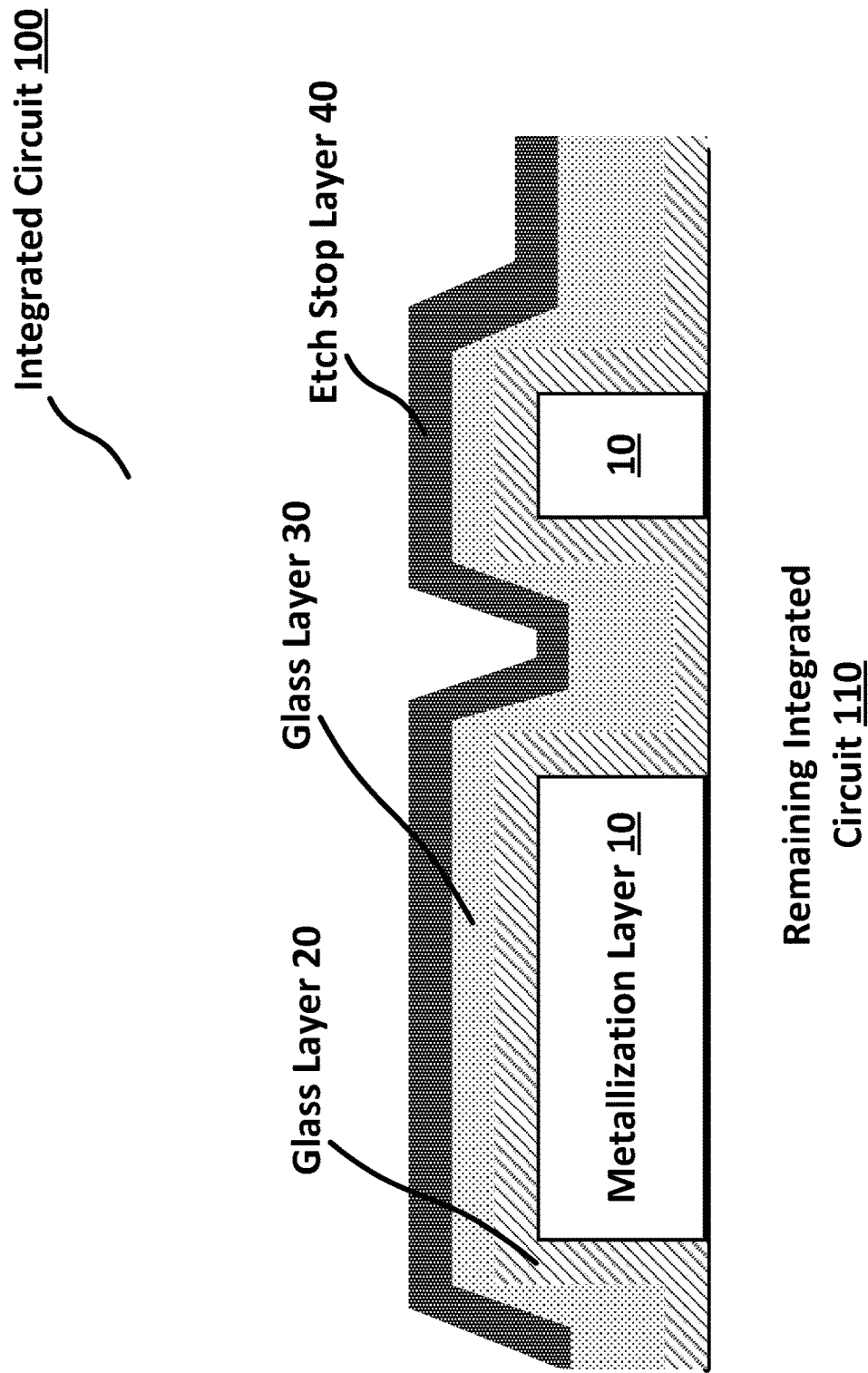

Referring to FIG. 1D, an etch stop layer 40 is deposited onto the glass layer 30. For example, a silicon nitride layer is deposited on the glass layer 30. In one example, the etch stop layer 40 is a silicon nitride layer that may be about a half micron thick±0.1 microns. In other examples, the etch stop layer 40 is between 0.4 and 1.5 microns thick. In other examples, the etch stop layer 40 may be silicon oxynitride or another dielectric that has a lower etch rate than silicon dioxide during a chemical mechanical polishing (CMP) process.

Figure 1E:
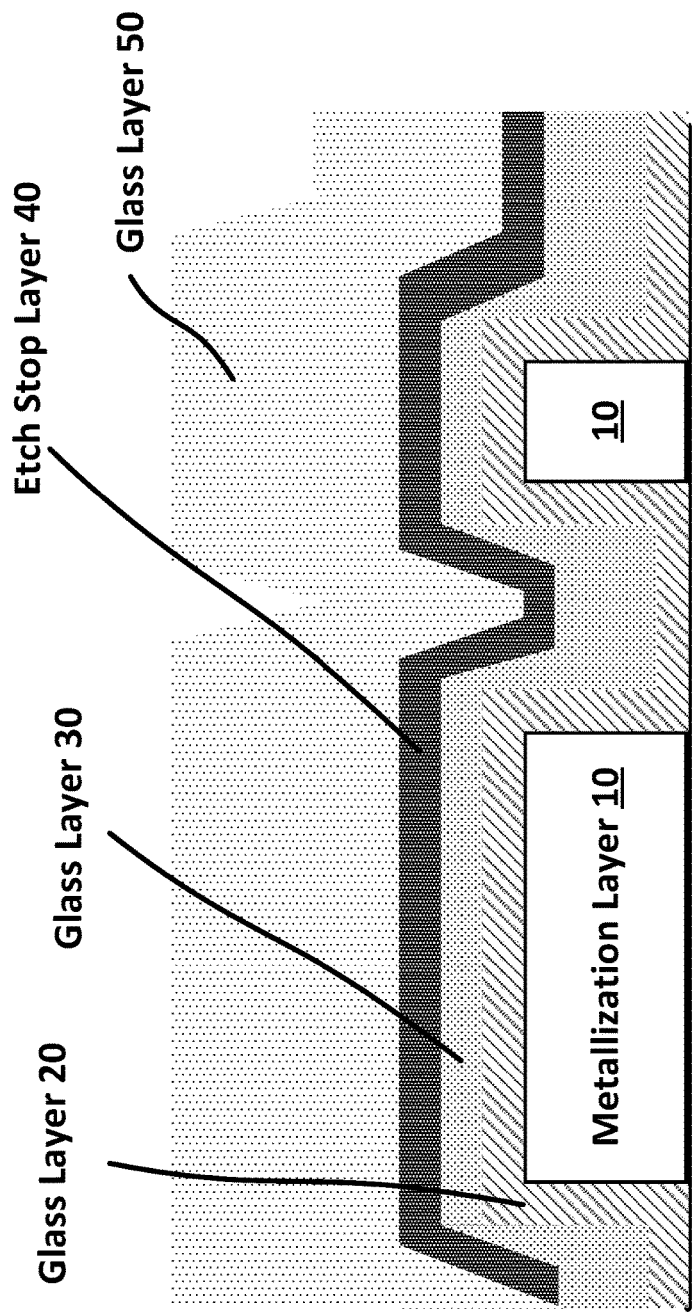

Referring to FIG. 1E, a glass layer 50 is deposited onto the etch stop layer 40. For example, the glass layer 50 is deposited onto the etch stop layer 40. In one example, the glass layer 50 may include tetraethyl orthosilicate (TEOS). In other examples, the glass layer 50 may be other types of dielectric films such as silicon oxynitride or doped silicon dioxide. In one example, the glass layer 50 may be about 2.2 microns thick±0.1 microns. The glass layer 50 has a selectivity to etching that is at least twice a selectivity to etching as the etch stop layer 40. For example, if the etch stop layer 40 is silicon nitride, the glass layer 50 has a selectivity to etching that is about 3 times a selectivity to etching of silicon nitride. In another example, if the glass layer 50 is TEOS, which has an etch/polish rate during the CMP process of about 60 Angstroms per sec, then the etch stop layer 40 has an etch/polish rate during the CMP process that is about 2 to 3 times less than 60 Angstroms per second.

In one example, a thickness of a passivation stack (i.e., the glass layer 20, glass layer 30, the etch stop layer 40 and the glass layer 50) above the metallization layer 10 prior to etching is between 1.5 to 2.5 times the thickness of the metallization layer 10. For example, if the metallization layer 10 is 2.5 microns thick, the passivation stack thickness above the metallization layer 10 prior to etching is about 3.8 microns.

Figure 1F:
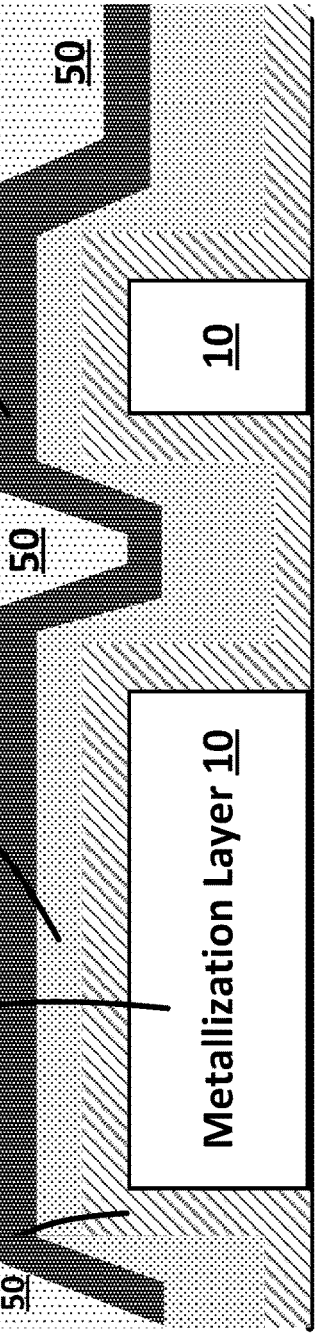

Referring to FIG. 1F, the glass layer 50 is polished and etched down to the etch stop layer 40. Portions of the glass layer 50 may remain. In some examples, portions of the etch stop layer 40 may be removed. The glass layer 20, the glass layer 30, the etch stop layer 40 and the glass layer 50 form a passivation stack.

Figure 1G:
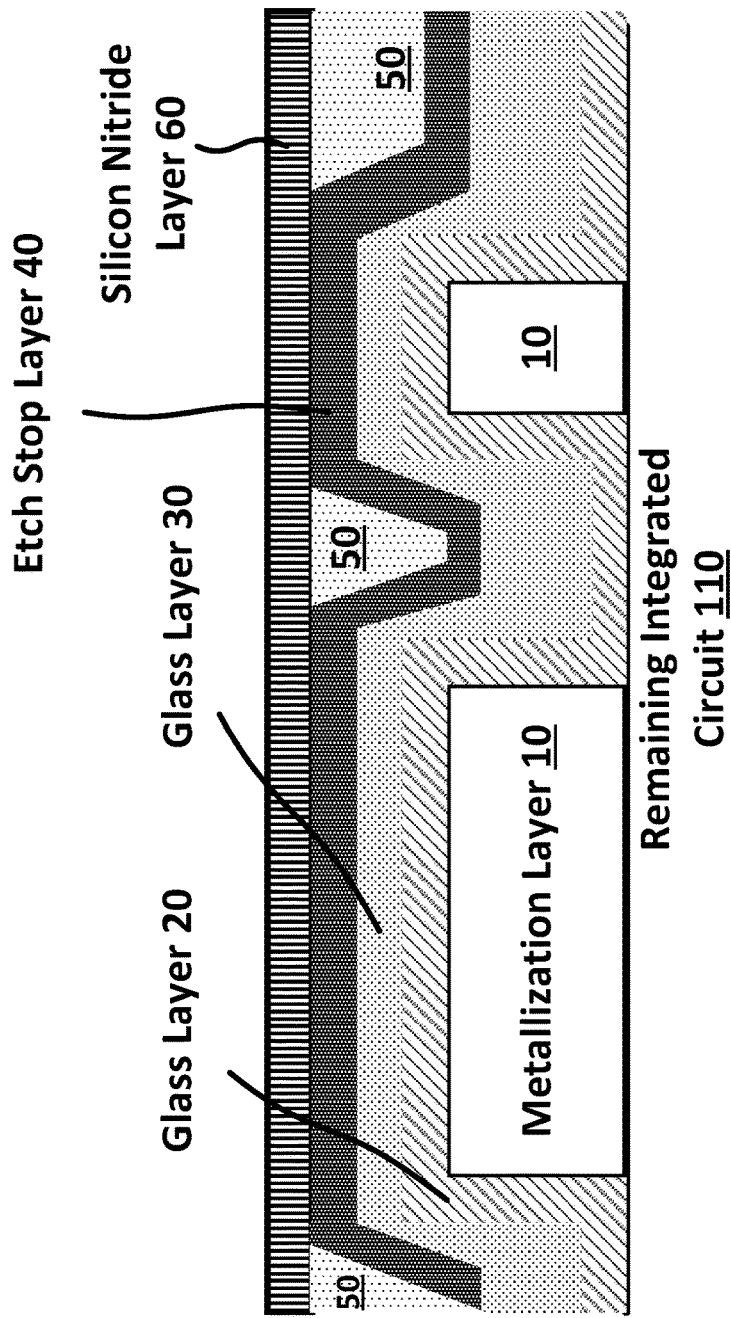

Referring to FIG. 1G, other layers may be added to the passivation stack. For example, a silicon nitride layer 60 may be deposited on to the etch stop layer 40 and the remaining glass layer 50. In one example, the silicon nitride layer 60 may be about a half of a micron thick±0.1 microns. In other examples, the silicon nitride layer 60 is between 0.4 and 1.5 microns thick.

Figure 2:
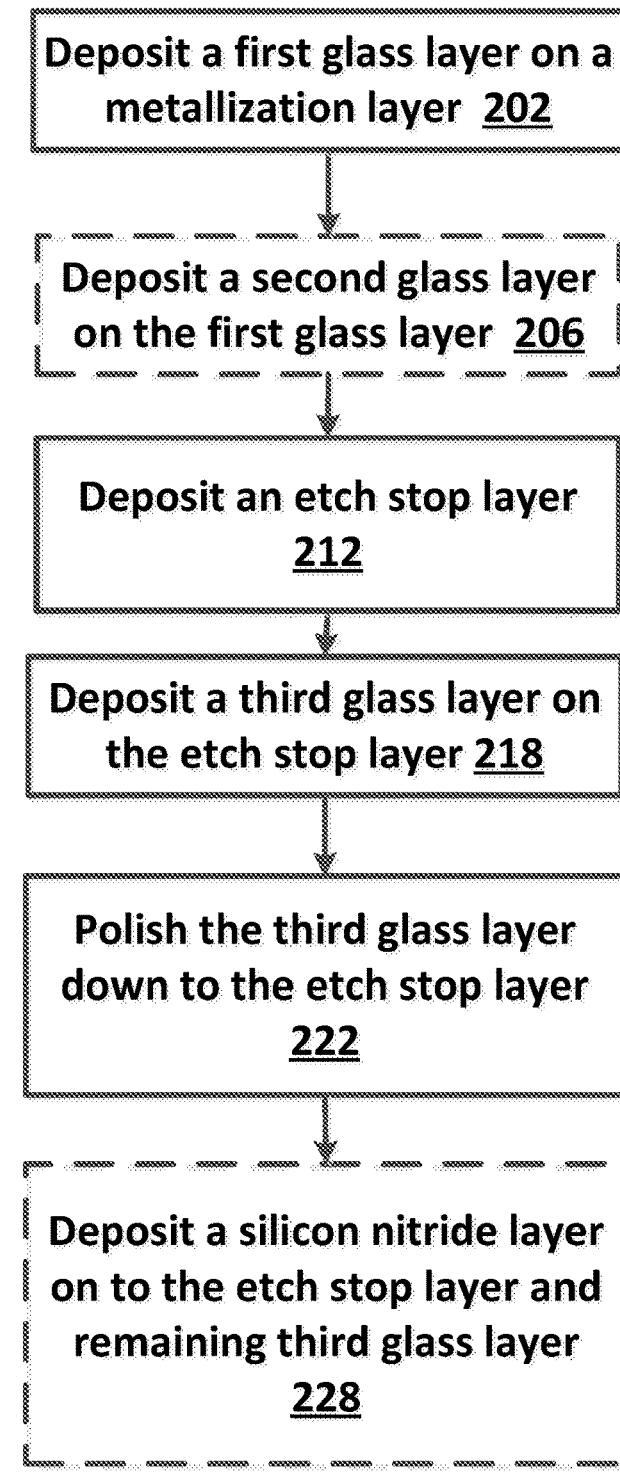
FIG. 2 is a flowchart of an example of a process to form the passivation stack having an etch stop layer.

Referring to FIG. 2, an example of a process to form a passivation stack having an etch stop layer is a process 200. For example, the process 200 may be used to form the IC 100 in FIG. 1F and/or FIG. 1G, each having a passivation stack with an etch stop layer.

Process 200 deposits a first glass layer on a metallization layer (202). For example, the glass layer 20 is deposited on the metallization layer 10 using plasma enhanced chemical vapor deposition between 350° C. and 400° C., as depicted in FIG. 1B. In one example, the glass layer 20 may include tetraethyl orthosilicate (TEOS).

Process 200 deposits a second glass layer on the first glass layer (206). For example, the glass layer 30 is deposited on the glass layer 20 using high density plasma, as depicted in FIG. 1C. In one example, the glass layer 30 may include a silane-based glass (e.g., silicon dioxide).

Process 200 deposits an etch stop layer on the second glass layer (212). For example, the etch stop layer 40 is deposited on the glass layer 30 using plasma enhanced chemical vapor deposition, as depicted in FIG. 1D. In one example, the etch stop layer covers the entire IC 100.

Process 200 deposits a third glass layer on the silicon nitride layer (218). For example, the glass layer 50 is deposited on the etch stop layer 40 using plasma enhanced chemical vapor deposition, as depicted in FIG. 1E. In one example, the glass layer 50 may include tetraethyl orthosilicate (TEOS).

Process 200 polishes the third glass layer down to the first silicon nitride layer (222). For example, the glass layer 50 is polished down to at least the surface of the etch stop layer 40 using a CMP process, as depicted in FIG. 1F.

Process 200 may deposit a silicon nitride layer on the etch stop layer and the remaining glass layer (228). For example, the silicon nitride layer 60 is deposited on the etch stop layer 40 and the remaining glass layer 50 using plasma enhanced chemical vapor deposition, as depicted in FIG. 1G.

Figure 3:
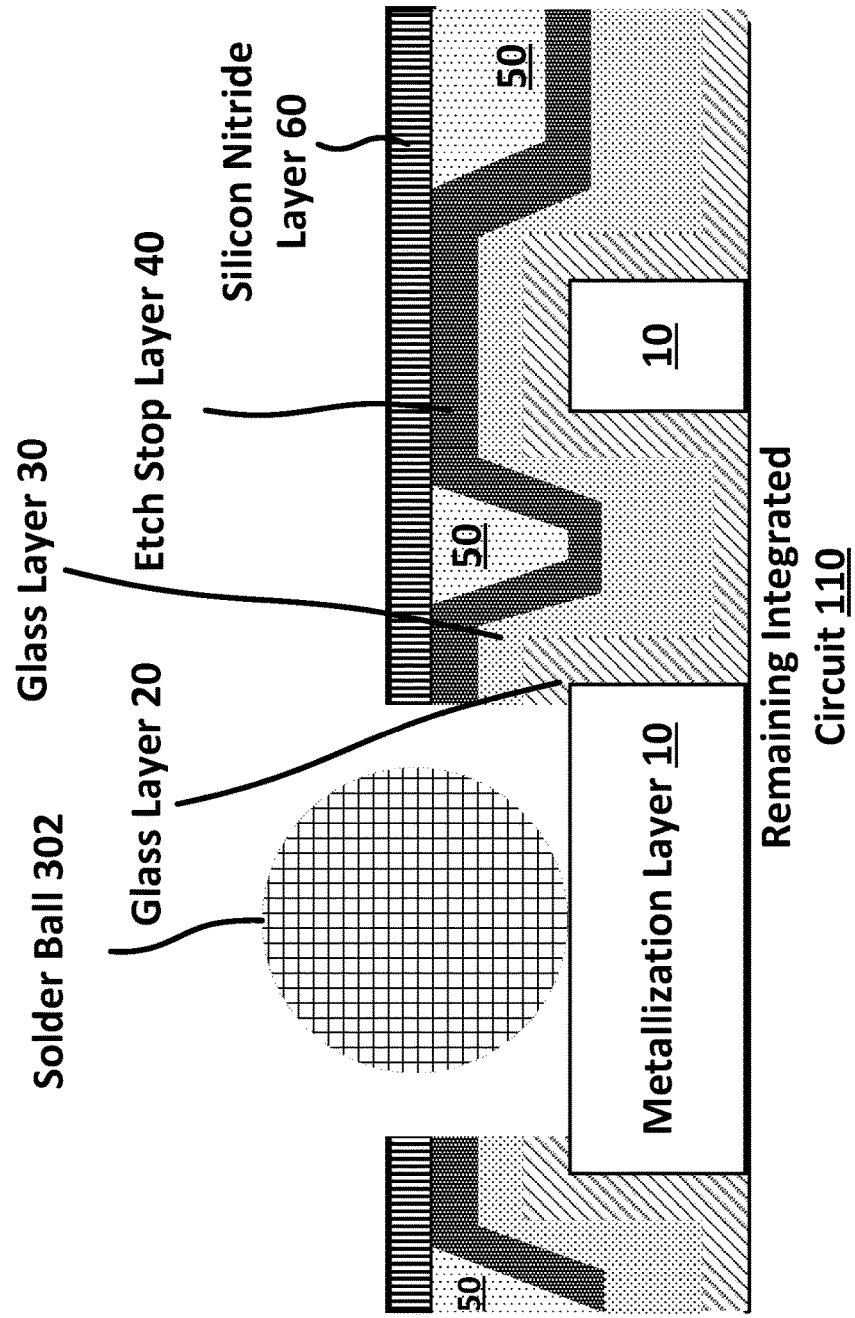
FIG. 3 is a diagram of the IC of FIG. 1G after etching the passivation stack at a bond pad and adding a solder ball.

Referring to FIG. 3, the metallization layer 10 may be accessed by etching through a portion of the passivation stack (e.g., the glass layer 20, the glass layer 30, the etch stop layer 40 and the silicon nitride layer 60). For example, a portion of the passivation stack is etched down to the metal portion 12 and a solder ball 302 from a ball gid array (not shown) is placed on the metal portion 12.

The processes described herein are not limited to the specific examples described. For example, the process 200 is not limited to the specific processing order of FIG. 2. Rather, any of the processing blocks of FIG. 2 may be re-ordered, combined, or removed, performed in parallel or in serial, as necessary, to achieve the results set forth above. For example, processing block 206 and/or processing block 228 may be removed.

Having described embodiments, which serve to illustrate various concepts, structures, and techniques, which are the subject of this patent, it will now become apparent to those of ordinary skill in the art that other embodiments incorporating these concepts, structures and techniques may be used.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A method comprising:
   forming a metallization layer on a portion of an integrated circuit comprising transistors, logic circuits or capacitors, wherein the metallization layer has a gap separating portions of the metallization layer;
   depositing a first glass layer on the metallization layer;
   depositing an etch stop layer on the first glass layer, wherein the etch stop layer has a recess between the separated portions of the metallization layer;
   depositing a second glass layer on the etch stop layer; and
   polishing the second glass layer down to at least a surface of the etch stop layer and leaving a separate portion of the second glass layer in the recess between the separated portions of the metallization layer.

2. The method of claim 1 further comprising depositing a third glass layer directly on the first glass layer;
   wherein depositing the etch stop layer on the first glass layer comprises depositing the etch stop layer directly on the third glass layer.

3. The method of claim 2, wherein depositing the third glass layer on the first glass layer comprises depositing a third glass layer comprising a silane-based glass using high density plasma.

4. The method of claim 3, wherein a total thickness of the first glass layer, the second glass layer, the third glass layer and the etch stop layer prior to the polishing is between 1.5 to 2.5 times a thickness of the metallization layer.

5. The method of claim 1, wherein the second glass layer has a selectivity to etching that is at least twice a selectivity to etching as the etch stop layer.

6. The method of claim 1, wherein depositing the etch stop layer on the first glass layer comprises depositing an etch stop layer having a thickness of about a half micron.

7. The method of claim 1, wherein depositing the etch stop layer on the first glass layer comprises depositing an etch stop layer having a thickness between 0.4 and 1.5 microns.

8. The method of claim 1, wherein depositing the etch stop layer on the first glass layer comprises depositing an etch stop layer comprising a silicon nitride on the first glass layer.

9. The method of claim 1, wherein depositing the etch stop layer on the first glass layer comprises depositing an etch stop layer comprising a silicon oxynitride on the first glass layer.

10. The method of claim 1, wherein depositing the etch stop layer on the first glass layer comprises depositing an etch stop layer comprising a dielectric that has an etch rate that is less than the second glass layer.

11. The method of claim 1, further comprising, after the polishing, depositing a silicon nitride layer on the etch stop layer using plasma enhanced chemical vapor deposition.

12. The method of claim 1, wherein depositing the etch stop layer comprises using plasma enhanced chemical vapor deposition to deposit the etch stop layer.

13. The method of claim 1, wherein depositing the first glass layer on the metallization layer comprises depositing the first glass layer on the metallization layer comprising a metal portion for a contact pad.

14. The method of claim 1, wherein polishing the second glass layer down to at least the surface of the etch stop layer comprises using a chemical mechanical polishing process.

15. The method of claim 1, wherein depositing the first glass layer on the metallization layer comprises using plasma enhanced chemical vapor deposition to deposit the first glass layer.

16. The method of claim 15, wherein depositing the first glass layer comprises depositing a first glass layer comprising tetraethyl orthosilicate.

17. The method of claim 1, wherein depositing the second glass layer on the etch stop layer comprises using plasma enhanced chemical vapor deposition to deposit the second glass layer.

18. The method of claim 17, wherein depositing the second glass layer on the etch stop layer comprises depositing a second glass layer comprising tetraethyl orthosilicate.

19. The method of claim 1, wherein a total thickness of the first glass layer, the second glass layer, the etch stop layer prior to the polishing is between 1.5 to 2.5 times a thickness of the metallization layer.

20. The method of claim 1, wherein the etch stop layer is silicon nitride.

21. The method of claim 20, wherein the second glass layer has a selectivity to etching that is three times a selectivity to etching of silicon nitride.

22. The method of claim 1, wherein the second glass layer is tetraethyl orthosilicate with an etch/polish rate during polishing of 60 angstroms per second.

23. The method of claim 22, wherein the etch stop layer has an etch/polish rate during polishing that is 2 to 3 times less than 60 angstroms per second.

24. The method of claim 4, wherein the metallization layer is 2.5 microns thick and the total thickness of the first glass layer, the second glass layer, the third glass layer and the etch stop layer prior to the polishing is 3.8 microns.

* * * * *